(12) United States Patent
Zhu et al.

(10) Patent No.: US 7,385,258 B2
(45) Date of Patent: Jun. 10, 2008

(54) TRANSISTORS HAVING V-SHAPE SOURCE/DRAIN METAL CONTACTS

(75) Inventors: Huilong Zhu, Poughkeepsie, NY (US); Haining Yang, Wappingers Falls, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/380,097

(22) Filed: Apr. 25, 2006

(65) Prior Publication Data

US 2007/0262396 A1 Nov. 15, 2007

(51) Int. Cl.
*H01L 29/76* (2006.01)
(52) U.S. Cl. ...................... 257/382; 257/627
(58) Field of Classification Search ........ 257/382–384, 257/347, 627, 915
See application file for complete search history.

(56) References Cited

U.S. PATENT DOCUMENTS

| | | | |
|---|---|---|---|
| 5,284,799 A | * | 2/1994 | Sato ........................... 438/618 |
| 6,136,698 A | * | 10/2000 | Lu ............................ 438/649 |
| 6,555,438 B1 | | 4/2003 | Wu | |
| 2006/0011990 A1 | * | 1/2006 | Furukawa et al. .......... 257/377 |

OTHER PUBLICATIONS

Jan, et al.; A 65NM Ultra Low Power Logic Platform Technology Using Uni-axial Strained Silicon Tranistors; 2005 IEEE; 07803-9269-8/05; 4 pages.

* cited by examiner

*Primary Examiner*—Mark Prenty
(74) *Attorney, Agent, or Firm*—Schmeiser, Olsen & Watts; Yuanmin Cai

(57) ABSTRACT

A semiconductor structure and a method for forming the same. The semiconductor structure includes (a) a semiconductor layer, (b) a gate dielectric region, and (c) a gate electrode region. The gate electrode region is electrically insulated from the semiconductor layer. The semiconductor layer comprises a channel region, a first and a second source/drain regions. The channel region is disposed between the first and second source/drain regions and directly beneath and electrically insulated from the gate electrode region. The semiconductor structure further includes (d) a first and a second electrically conducting regions, and (e) a first and a second contact regions. The first electrically conducting region and the first source/drain region are in direct physical contact with each other at a first and a second common surfaces. The first and second common surfaces are not coplanar. The first contact region overlaps both the first and second common surfaces.

5 Claims, 18 Drawing Sheets

TRANSISTORS HAVING V-SHAPE SOURCE/DRAIN METAL CONTACTS

BACKGROUND OF THE INVENTION

1. Technical Field

The present invention relates to semiconductor transistor, and more specifically, to semiconductor transistor having V-shape source/drain metal contact.

2. Related Art

In a conventional semiconductor transistor, contact regions are formed on the source/drain regions of the transistor to provide electrical access to the transistor. Therefore, there is a need to reduce the resistance between the contact regions and the source/drain regions of the transistor.

SUMMARY OF THE INVENTION

The present invention provides a semiconductor structure, comprising (a) a semiconductor layer; (b) a gate dielectric region on top of the semiconductor layer; (c) a gate electrode region on top of the gate dielectric region, wherein the gate electrode region is electrically insulated from the semiconductor layer by the gate dielectric region, wherein the semiconductor layer comprises a channel region, a first source/drain region, and a second source/drain region, and wherein the channel region is disposed between the first and second source/drain regions and directly beneath and electrically insulated from the gate electrode region by the gate dielectric region; (d) a first electrically conducting region and a second electrically conducting region on top of the first and second source/drain regions, respectively; and (e) a first contact region and a second contact region on top of and electrically coupled to the first and second electrically conducting regions, respectively; wherein the first electrically conducting region and the first source/drain region are in direct physical contact with each other at a first common surface and a second common surface, wherein the first and second common surfaces are not coplanar, and wherein the first contact region overlaps both the first and second common surfaces.

The present invention provides a semiconductor fabrication method, comprising providing a semiconductor structure which includes (a) a semiconductor layer, (b) a gate dielectric region on top of the semiconductor layer, (c) a gate electrode region on top of the gate dielectric region, wherein the gate electrode region is electrically insulated from the semiconductor layer by the gate dielectric region; removing a first portion and a second portion of the semiconductor layer; after said removing the first and second portions of the semiconductor layer, forming a first source/drain region and a second source/drain region in the semiconductor layer directly beneath the removed first and second portions, respectively, wherein the semiconductor layer comprises a channel region, and wherein the channel region is disposed between the first and second source/drain regions and directly beneath and electrically insulated from the gate electrode region by the gate dielectric region; after said forming the first and second source/drain regions is performed, forming a first electrically conducting region and a second electrically conducting region on top of the first source/drain region and the second source/drain region, respectively, wherein the first electrically conducting region and the first source/drain region are in direct physical contact with each other at a first common surface and a second common surface, and wherein the first and second common surfaces are not coplanar; and after said forming the first and second electrically conducting regions is performed, forming a first contact region and a second contact region on top of and electrically coupled to the first and second electrically conducting regions, respectively, wherein the first contact region overlaps both the first and second common surfaces.

The present invention provides a semiconductor structure, comprising (a) a semiconductor layer; (b) a first gate dielectric region and a second gate dielectric region on top of the semiconductor layer; (c) a first gate electrode region on top of the first gate dielectric region, wherein the first gate electrode region is electrically insulated from the semiconductor layer by the first gate dielectric region, wherein the semiconductor layer comprises a first channel region, a first source/drain region, and a second source/drain region, and wherein the first channel region is disposed between the first and second source/drain regions and directly beneath and electrically insulated from the first gate electrode region by the first gate dielectric region; (d) a second gate electrode region on top of the second gate dielectric region, wherein the second gate electrode region is electrically insulated from the semiconductor layer by the second gate dielectric region, wherein the semiconductor layer further comprises a second channel region and a third source/drain region, and wherein the second channel region is disposed between the second and third source/drain regions and directly beneath and electrically insulated from the second gate electrode region by the second gate dielectric region; (e) a first electrically conducting region, a second electrically conducting region and a third electrically conducting region on top of the first, second, and third source/drain regions, respectively; and (f) a first contact region, a second contact region and a third contact region on top of and electrically coupled to the first, second and third electrically conducting regions, respectively; wherein the second electrically conducting region and the second source/drain region are in direct physical contact with each other at a first common surface and a second common surface, wherein the first and second common surfaces are not coplanar, and wherein the second contact region overlaps both the first and second common surfaces.

The present invention provides a semiconductor transistor structure (and a method for forming the same) in which the resistance between the contact regions and the source/drain regions of the semiconductor transistor structure is reduced.

DETAILED DESCRIPTION OF THE INVENTION

Figure 1A:
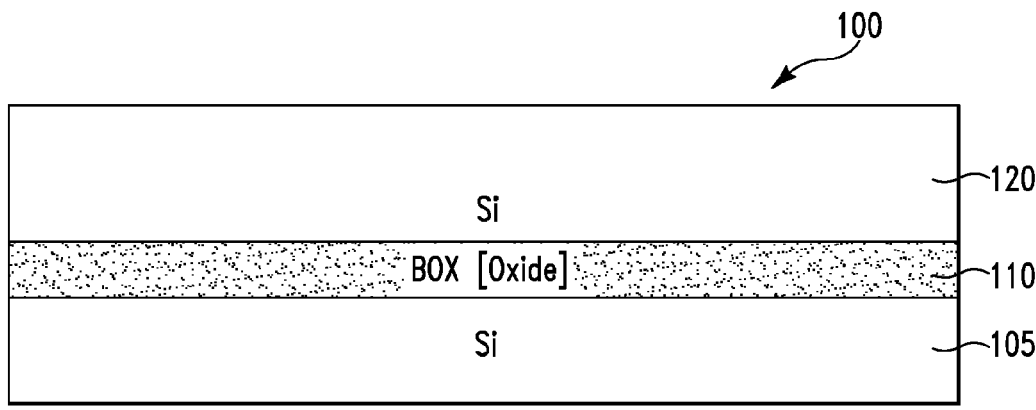
FIGS. 1A-11B show cross-section views used to illustrate a first fabrication process for forming a semiconductor structure, in accordance with embodiments of the present invention.

FIGS. 1A-11B show cross-section views used to illustrate a first fabrication process for forming a semiconductor structure 100, in accordance with embodiments of the present invention. More specifically, with reference to FIG. 1A, in one embodiment, the first fabrication process starts with an SOI (Silicon On Insulator) substrate 105+110+120.

Illustratively, the SOI substrate 105+110+120 comprises a silicon layer 105, a silicon dioxide layer 110 (BOX layer) on top of the silicon layer 105, and a silicon layer 120 on top of the silicon dioxide layer 110. In one embodiment, the SOI substrate 105+110+120 can be formed by a conventional method.

Figure 1B:
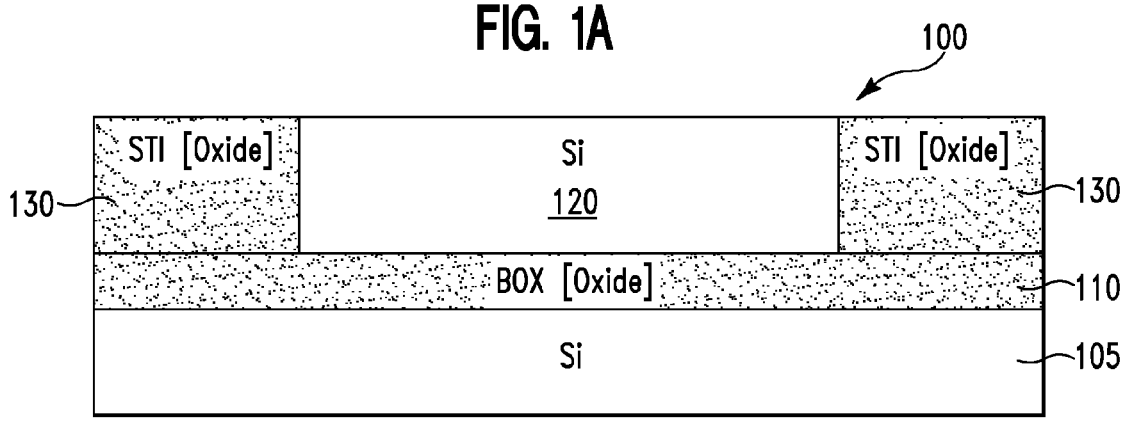

Next, with reference to FIG. 1B, in one embodiment, shallow trench isolation (STI) regions 130 are formed in the silicon layer 120. Illustratively, the STI regions 130 comprise silicon dioxide. In one embodiment, the STI regions 130 can be formed by a conventional method.

Figure 1C:
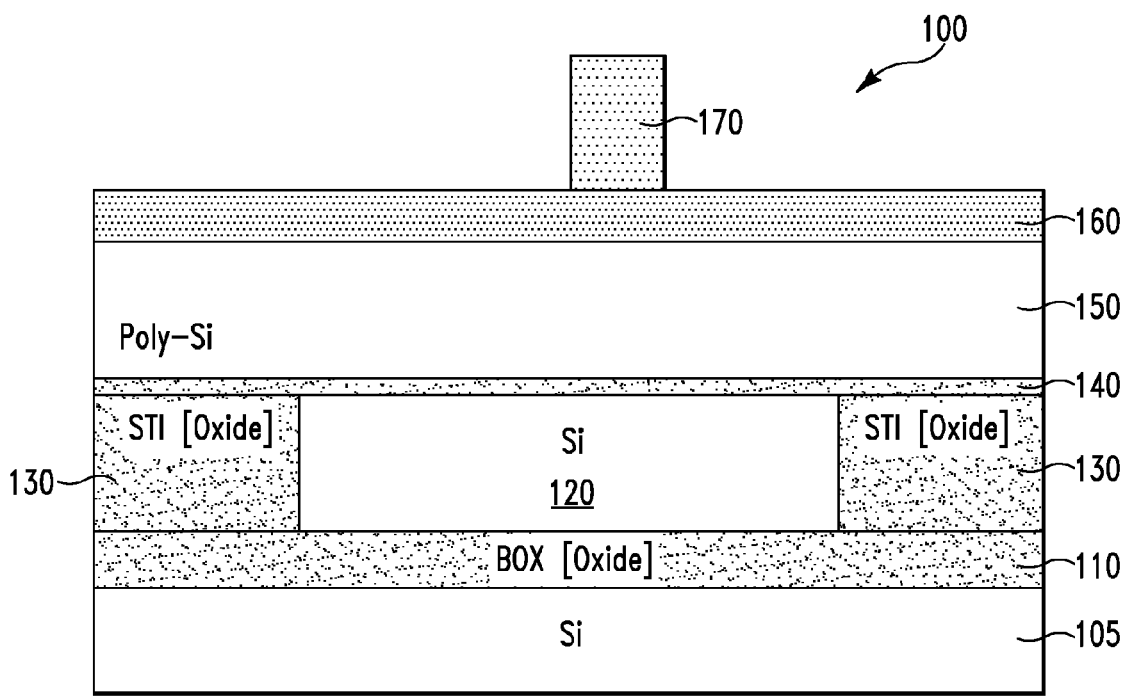

Next, with reference to FIG. 1C, in one embodiment, a gate dielectric layer 140 is formed on top of the structure 100 of FIG. 1B. Illustratively, the gate dielectric layer 140 comprises silicon dioxide. In one embodiment, the gate dielectric layer 140 can be formed by CVD (Chemical Vapor Deposition) or thermal oxidation.

Next, in one embodiment, a gate electrode layer 150 is formed on top of the gate dielectric layer 140. Illustratively, the gate electrode layer 150 comprises poly-silicon. In one embodiment, the gate electrode layer 150 can be formed by CVD.

Next, in one embodiment, a nitride layer 160 is formed on top of the gate electrode layer 150. Illustratively, the nitride layer 160 comprises silicon nitride. In one embodiment, the nitride layer 160 can be formed by CVD.

Next, in one embodiment, a patterned photoresist layer 170 is formed on top of the nitride layer 160 using a conventional method.

Figure 2:
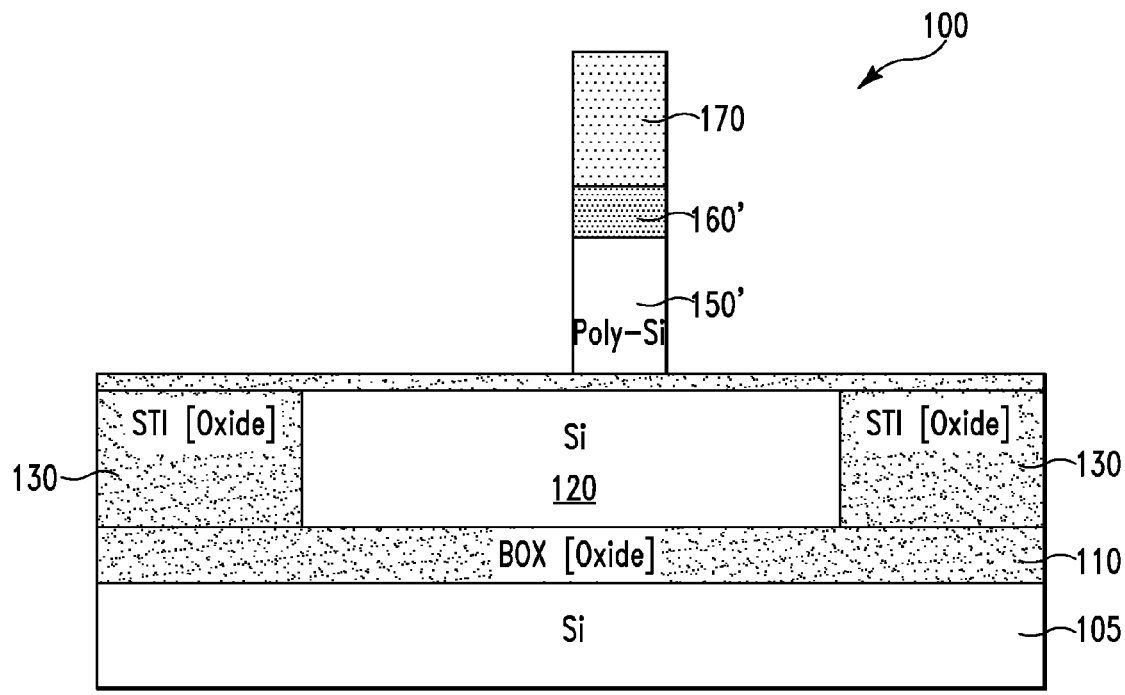

Next, in one embodiment, the patterned photoresist layer 170 is used as a mask for anisotropically etching the nitride layer 160 and then the poly-silicon gate electrode layer 150 stopping at the gate dielectric layer 140, resulting in a nitride region 160' and a gate electrode region 150' as shown in FIG. 2.

Next, with reference to FIG. 2, in one embodiment, the patterned photoresist layer 170 is removed by, illustratively, wet etching. It should be noted that the nitride region 160' and the gate electrode region 150' can be collectively referred to as a gate stack 160'+150'. Next, with reference to FIG. 3, in one embodiment, the gate stack 160'+150' is used as a blocking mask for forming extension regions 310a and 310b and the halo regions 320a and 320b in the layer 120 by ion implantation. In one embodiment, the extension regions 310a and 310b define a channel region 122 disposed between the extension regions 310a and 310b and directly beneath and electrically isolated from the gate electrode region 150' by the gate dielectric layer 140.

Figure 3:
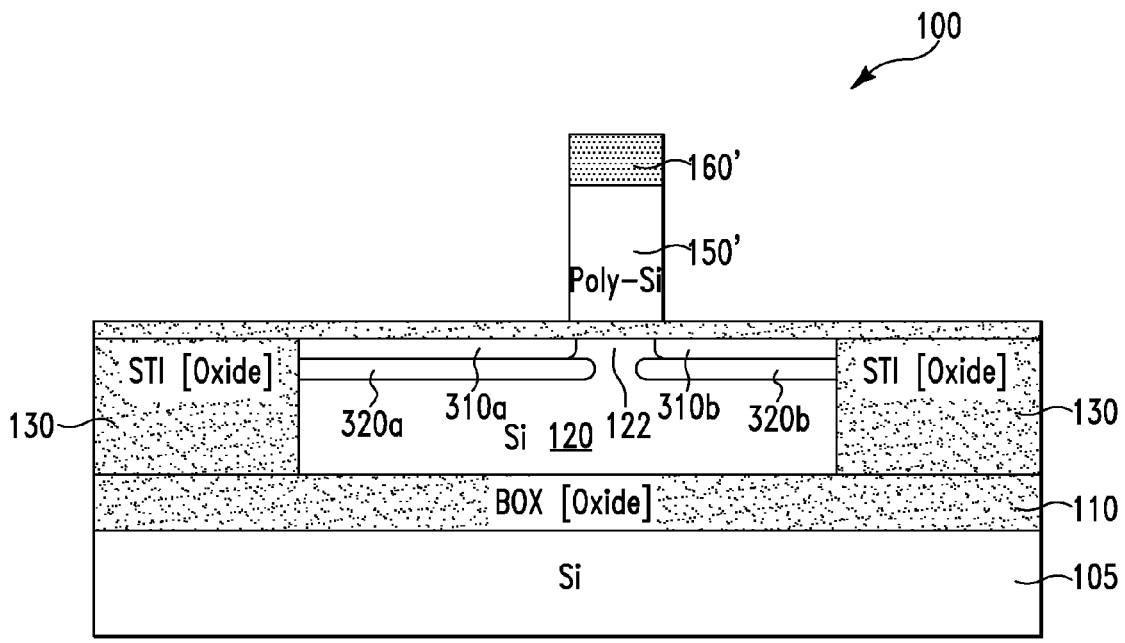
Figure 4A:
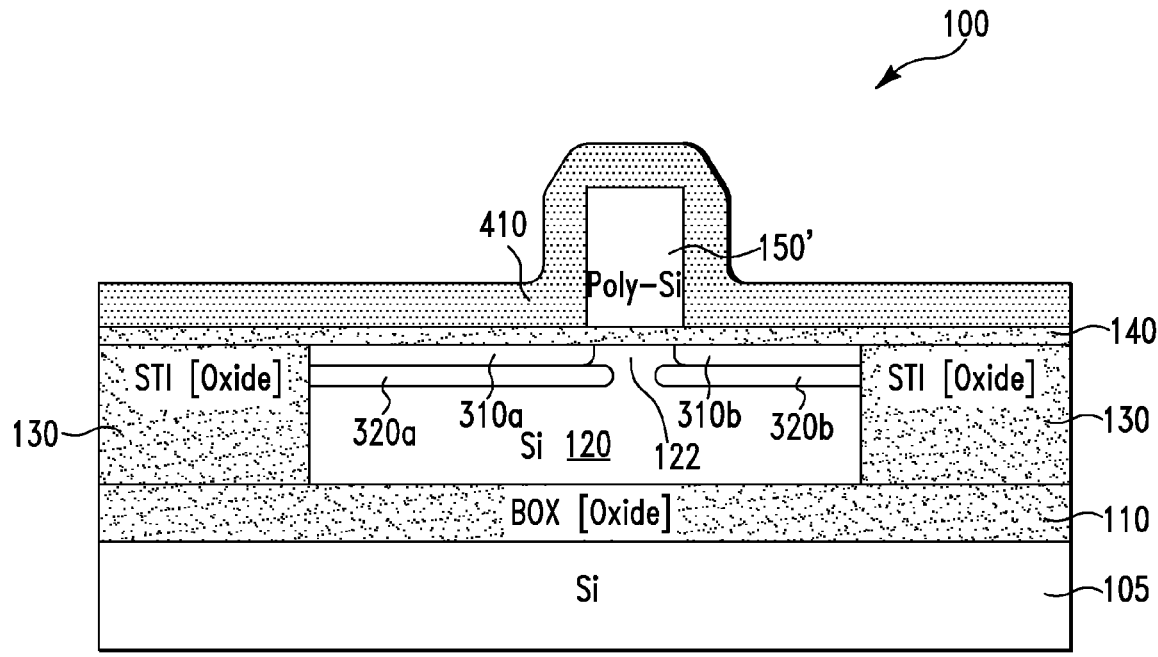

Next, with reference to FIG. 4A, in one embodiment, a nitride spacer layer 410 is formed on top of the structure 100 of FIG. 3. Illustratively, the nitride spacer layer 410 can be formed by CVD of a nitride material (silicon nitride) on top of the structure 100 of FIG. 3. This deposited nitride material combines with the nitride region 160' (FIG. 3) resulting in the nitride spacer layer 410 of FIG. 4A.

Figure 4B:
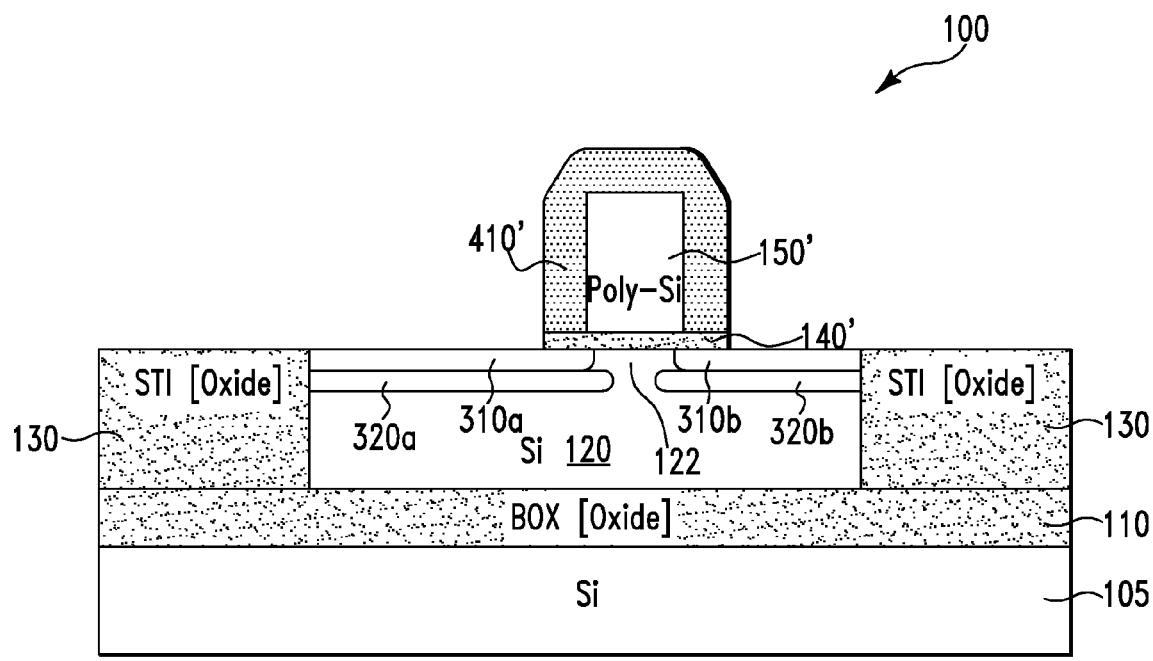

Next, in one embodiment, the nitride spacer layer 410 and the gate dielectric layer 140 are anisotropically etched stopping at the silicon layer 120 resulting in structure 100 of FIG. 4B. As a result of the etching the nitride spacer 410 and the gate dielectric layer 140 of FIG. 4A, what remains of the gate dielectric layer 140 is the gate dielectric region 140' of FIG. 4B and what remains of the nitride spacer layer 410 is the nitride spacer region 410'. It should be noted that the nitride spacer region 410' and the gate electrode region 150' can be collectively referred to as a gate stack 410'+150'.

Figure 5:
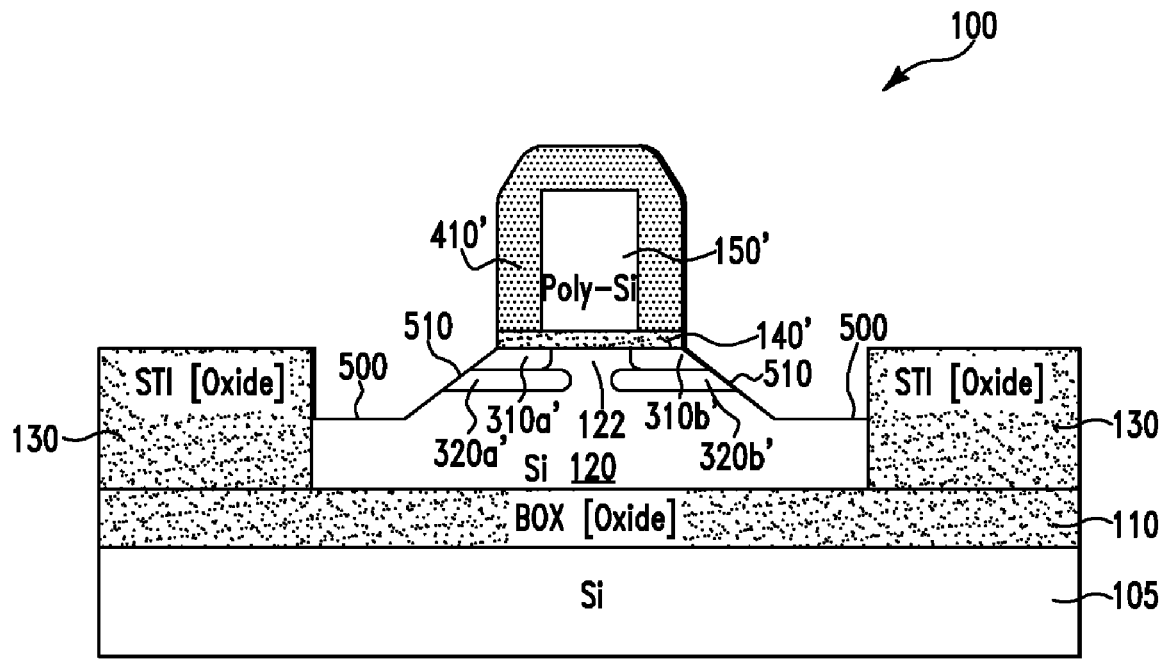

Next, in one embodiment, the gate stack 410'+150' is used as a mask for etching the silicon layer 120 resulting in two surfaces 500 and 510 as shown in FIG. 5. In one embodiment, the etching of the silicon layer 120 uses dilute ammonia (wet etching). It should be noted that other etchants can be used for the etching of the silicon layer 120. For example, possible etchants are (a) TMAH Tetramethylammonium hydroxide, (b) KOH Potassium hydroxide (Note: slots in the STI 130 and spacers 410' were translated into V-grooves in the underlying silicon 120 using 40% weight KOH solution at 70° C. with 5% IPA added and mechanical agitation), and (c) EDP Ethylene diamine pyrocatechol.

Illustratively, the surfaces 500 and 510 form a V-shape. In one embodiment, the surfaces 500 and 510 are in (100) and (111) crystalline planes, respectively, and the angle between the surfaces 500 and 510 is about 125°. This occurs if (a) the top surface of the Si layer 120 (FIG. 1A) is in (100) crystalline plane and (b) the gate direction (which is perpendicular to the page) is <110>. As a result, the wet etching of the Si layer 120 results in (100) planes being etched much faster than (111) planes. Therefore, the surface 500 is etched and recessed, whereas the surface 510 remains as shown in FIG. 5.

In an alternative embodiment, the surfaces 500 and 510 are in (100) and (110) crystalline planes, respectively, and the angle between the surfaces 500 and 510 is about 135°. This occurs if (a) the top surface of the Si layer 120 (FIG. 1A) is in (110) crystalline plane and (b) the gate direction (which is perpendicular to the page) is <111>.

In yet another alternative embodiment, the surfaces 500 and 510 are in (110) and (111) crystalline planes, respectively, and the angle between the surfaces 500 and 510 is about 145°. This occurs if (a) the top surface of the Si layer 120 (FIG. 1A) is in (110) crystalline plane and (b) the gate direction (which is perpendicular to the page) is <110>.

Figure 6:
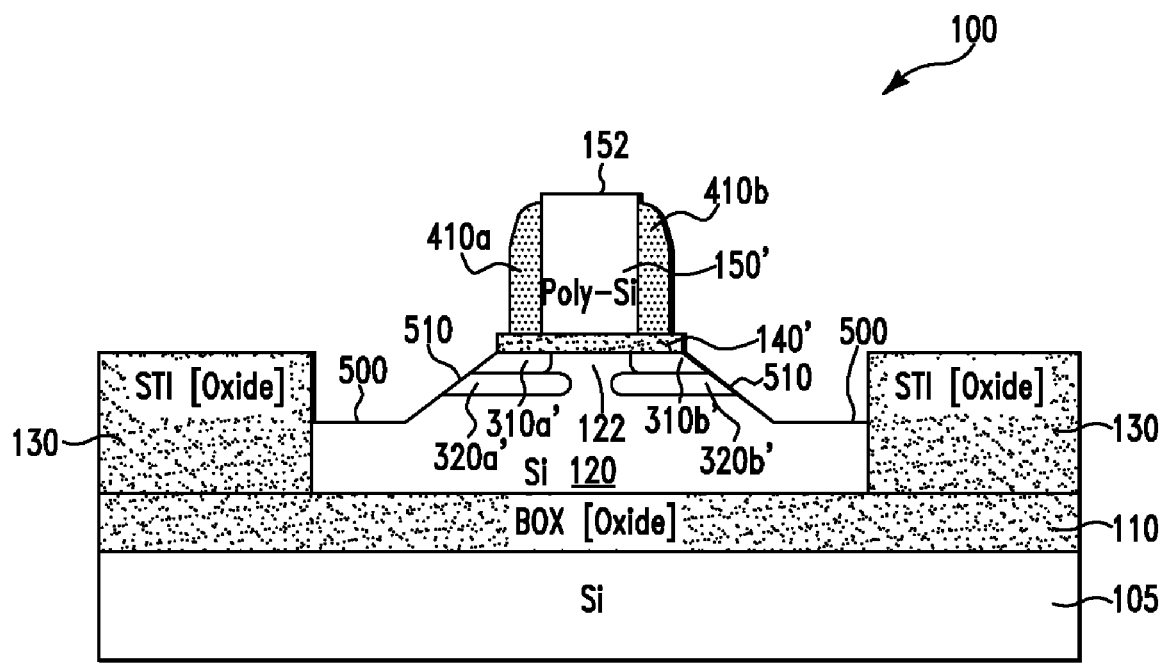

Next, in one embodiment, the nitride spacer region 410' is anisotropically etched until a top surface 152 of the gate electrode region 150' is exposed to the surrounding ambient resulting in the structure 100 of FIG. 6. As a result of the etching the nitride spacer region 410' of FIG. 5, what remain of the nitride spacer region 410' are nitride spacer regions 410a and 410b of FIG. 6. It should be noted that the nitride spacer regions 410a and 410b, the gate electrode region 150', and the gate dielectric region 140' can be collectively referred to as a gate stack 410a+410b+150'+140'.

Figure 7:
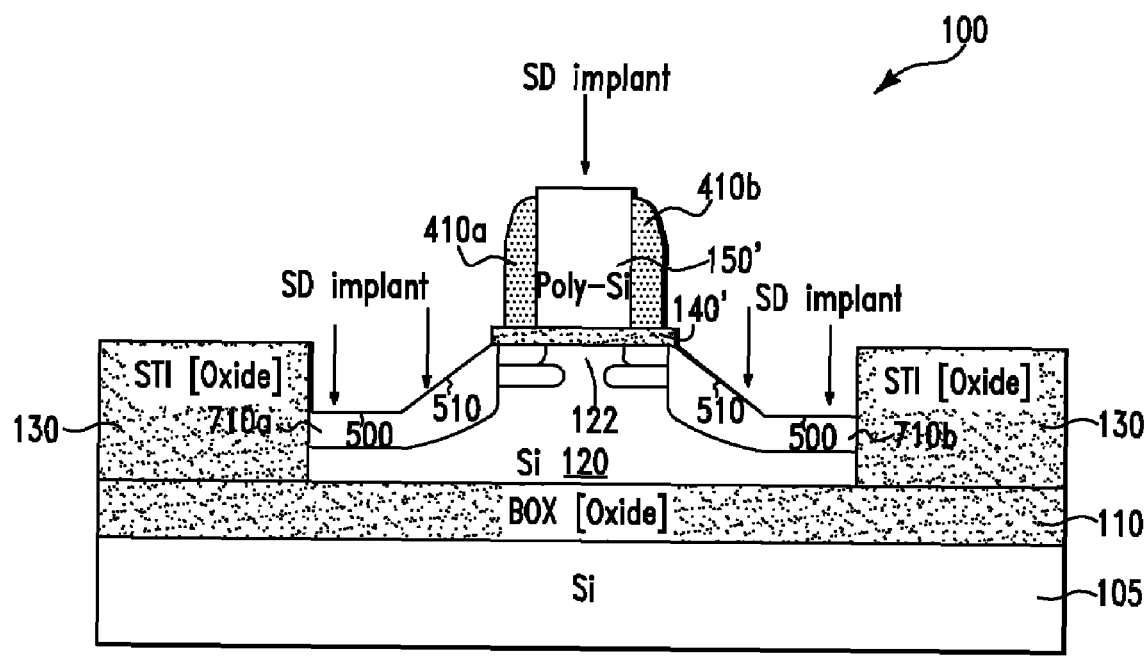

Next, with reference to FIG. 7, in one embodiment, the gate stack 410a+410b+150'+140' is used as a blocking mask for ion implanting the layer 120 resulting in source/drain regions 710a and 710b in the silicon layer 120.

Figure 8:
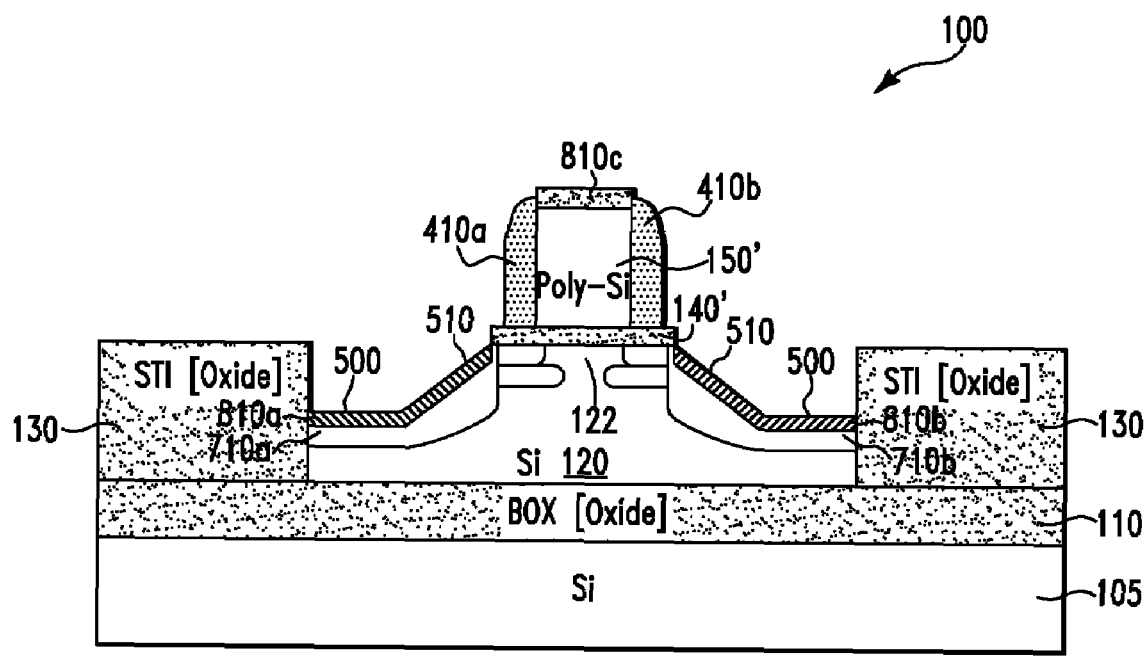

Next, with reference to FIG. 8, in one embodiment, silicide regions 810a, 810b, and 810c are formed on top of the source/drain regions 710a and 710b and the gate electrode region 150', respectively. Illustratively, the silicide regions 810a, 810b, and 810c comprise nickel silicide (NiSi). In one embodiment, the silicide regions 810a, 810b, and 810c can be formed by (i) depositing metal Ni on top of the structure 100 of FIG. 7, then (ii) annealing the structure 100 at high temperature (300° C.-450° C.) to cause the deposited Ni to chemically react with Si of the source/drain regions 710a, 710b and the gate electrode region 150', and then (iii) removing the unreacted metal by wet etching, resulting in the silicide regions 810a, 810b, and 810c of FIG. 8.

Figure 9:
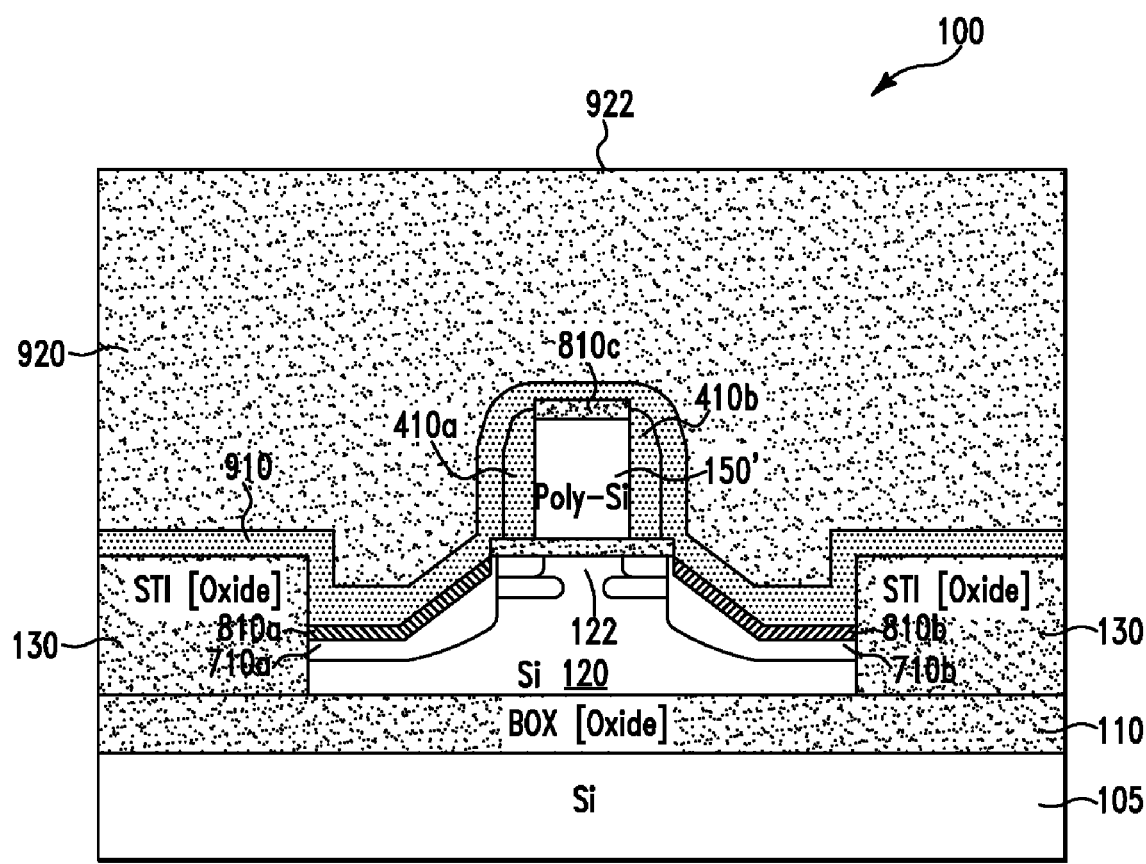

Next, with reference to FIG. 9, in one embodiment, a nitride liner layer 910 is formed on top of the structure 100 of FIG. 8. Illustratively, the nitride liner layer 910 comprises silicon nitride. In one embodiment, the nitride liner layer 910 can be formed by CVD.

Next, in one embodiment, an oxide layer 920 is formed on top of the nitride liner layer 910. Illustratively, the oxide layer 920 comprises silicon dioxide. In one embodiment, the oxide layer 920 can be formed by CVD of silicon dioxide followed by a CMP (chemical mechanical polishing) so as to form a planar surface 922 on top.

Figure 10:
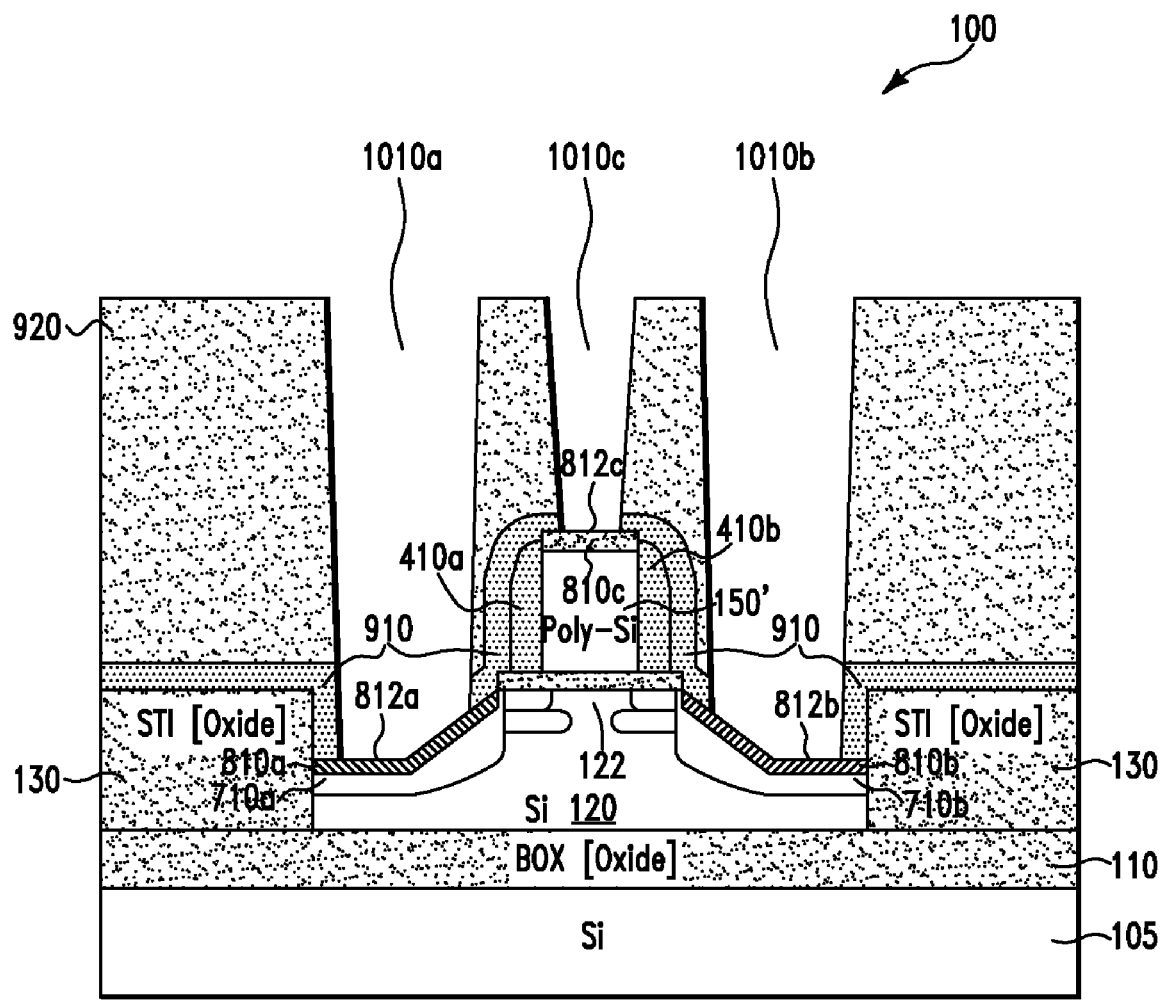

Next, with reference to FIG. 10, in one embodiment, contact holes 1010a, 1010b, and 1010c are created in the oxide layer 920, the nitride liner layer 910 by, illustratively, lithography and etching process such that the top surfaces 812a, 812b, and 812c of the silicide regions 810a, 810b, and 810c, respectively, are exposed to the surrounding ambient through the contact holes 1010a, 1010b, and 1010c. Next, in one embodiment, the patterned photoresist layer 930 can be removed by wet etching.

Figure 11A:
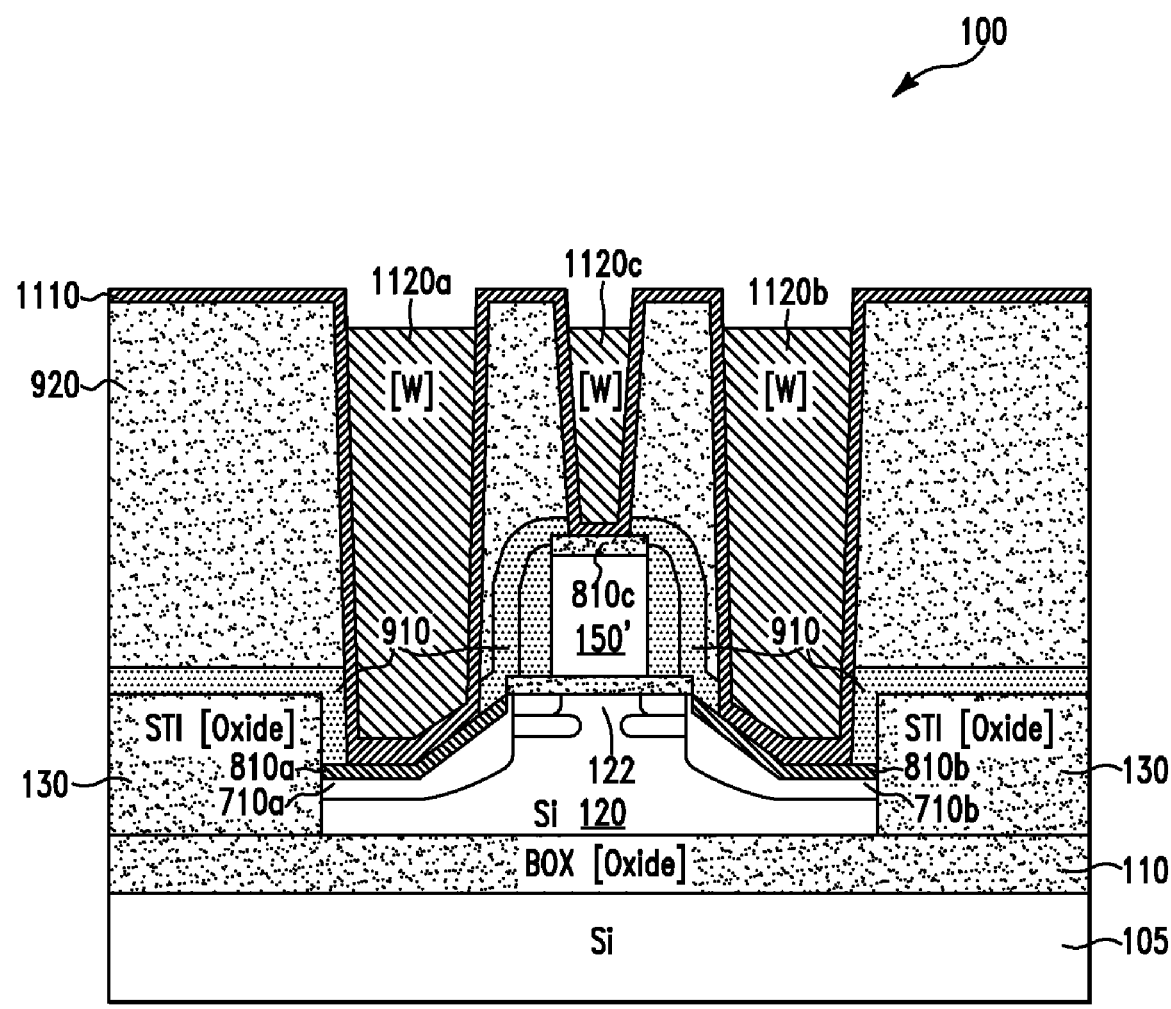

Next, with reference to FIG. 11A, in one embodiment, an electric conductive layer 1110 is formed on top of the structure 100 of FIG. 10. Illustratively, the electric conduction layer 1110 comprises titanium nitride (TiN). In one embodiment, the electric conductive layer 1110 can be formed by CVD.

Next, in one embodiment, contact regions 1120a, 1120b, and 1120c are formed in the contact holes 1010a, 1010b, and 1010c, respectively. Illustratively, the regions 1120a, 1120b, and 1120c comprise tungsten (W). In one embodiment, the contact regions 1120a, 1120b, and 1120c can be formed by CVD and then etching the W outside the contact holes 1010a, 1010b, and 1010c.

Figure 11B:
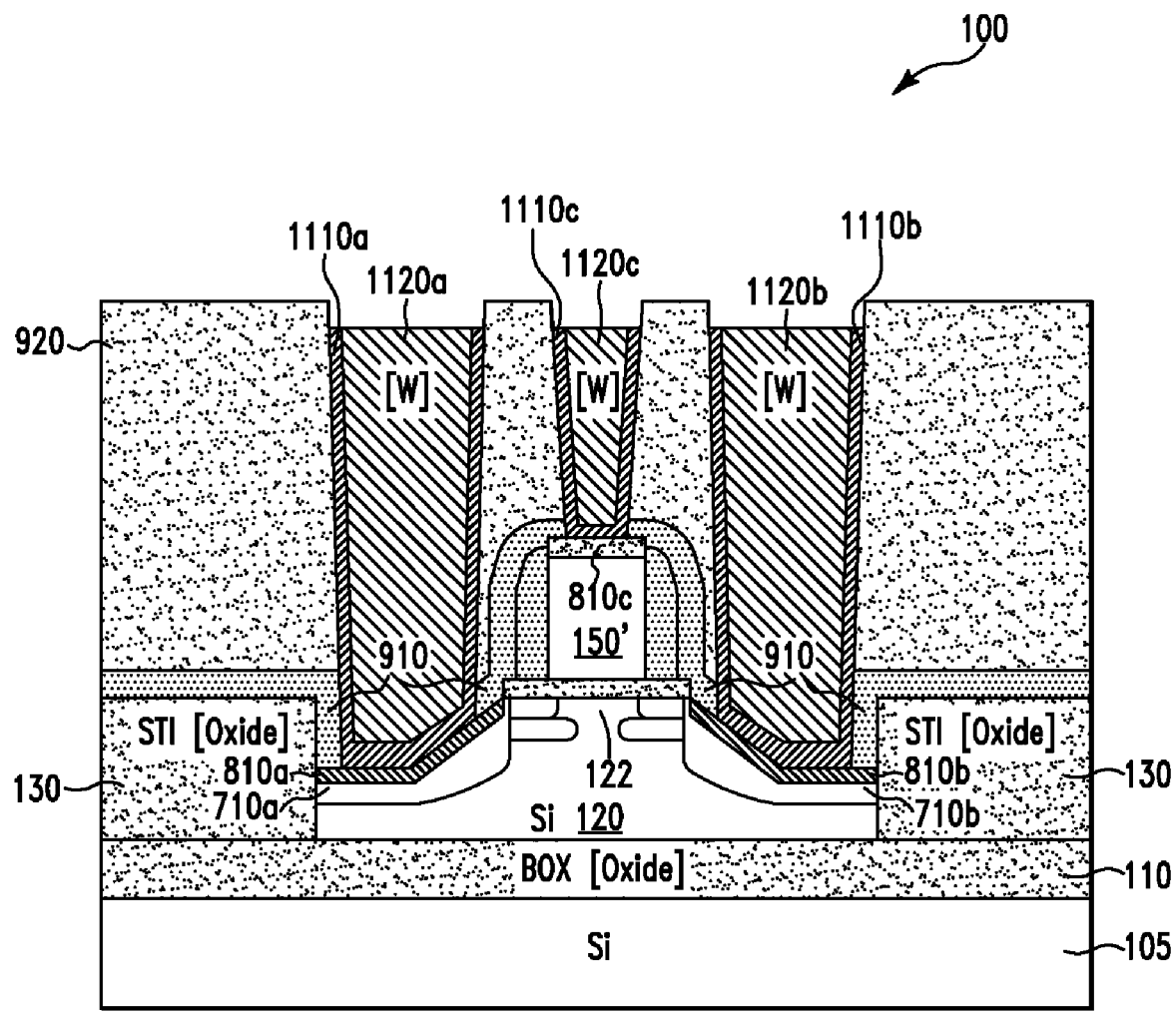

Next, in one embodiment, exposed regions of the electric conductive layer 1110 are etched by, illustratively, wet etching resulting in electric conductive regions 1110a, 1110b, and 1110c as shown in FIG. 11B.

In summary, contact interfacing surfaces between the silicide regions 810a and 810b and the source/drain regions 710a and 710b, respectively, are V-shape. As a result, the contact interfacing surfaces are larger than planar contact interfacing surfaces, resulting in lower contact resistance than in the prior art.

Figure 12:
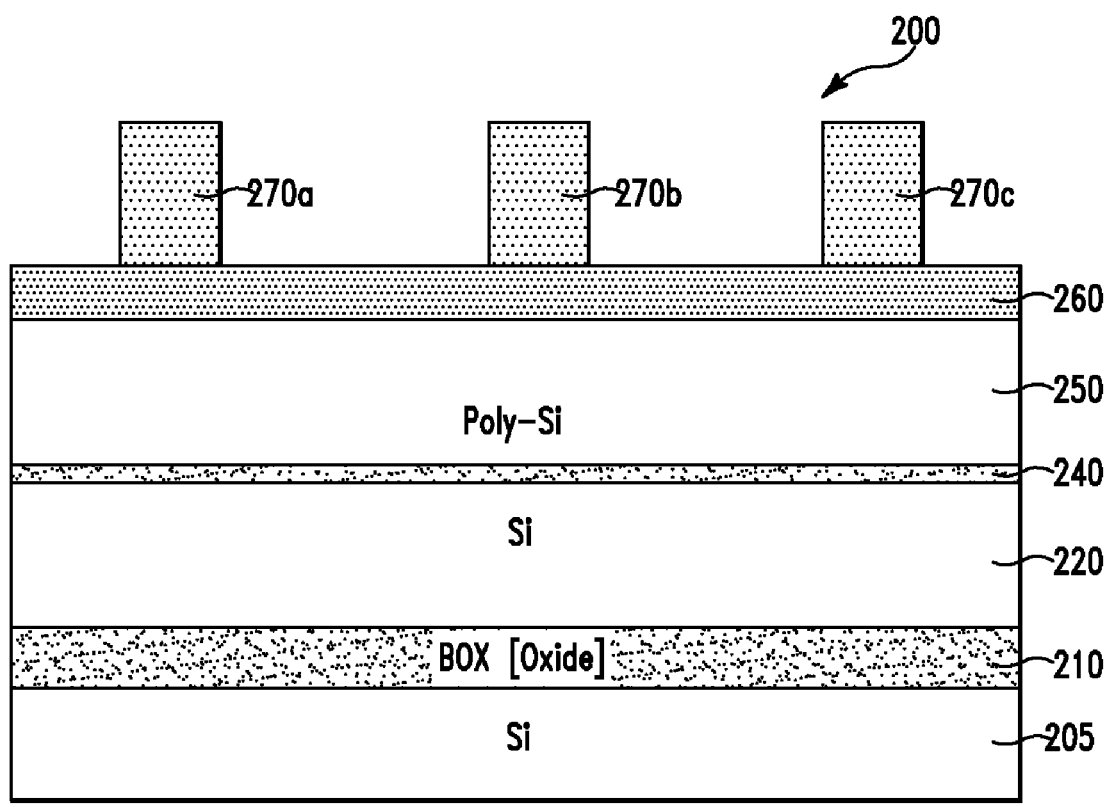
FIGS. 12-23 show cross-section views used to illustrate a second fabrication process for forming a semiconductor structure, in accordance with embodiments of the present invention.

FIGS. 12-23 show cross-section views used to illustrate a second fabrication process for forming a semiconductor structure 200, in accordance with embodiments of the present invention. More specifically, with reference to FIG. 12, in one embodiment, the second fabrication process starts with a structure 200 of FIG. 12. In one embodiment, the structure 200 of FIG. 12 is similar to the structure 100 of FIG. 1C except that the structure 200 has three photoresist regions 270a, 270b, and 270c and the STI regions 130 in FIG. 1C are not formed in the structure 200 of FIG. 12.

Figure 13:
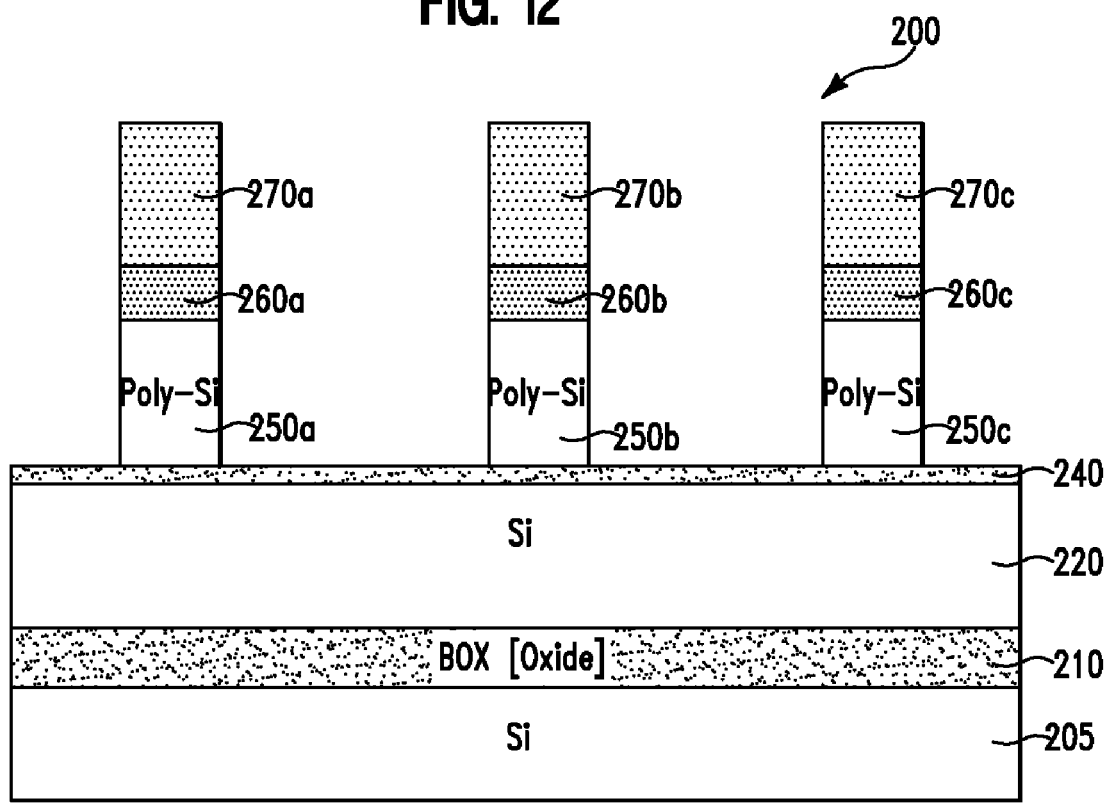

Next, with reference to FIG. 13, in one embodiment, nitride regions 260a, 260b, and 260c and gate electrode regions 250a, 250b, and 250c are formed using a process similar to the process to the formation of the nitride region 160' and the gate electrode region 150' of FIG. 2.

Next, in one embodiment, patterned photoresist layers 270a, 270b, and 270c are removed by, illustratively wet etching. Next, with reference to FIG. 14, in one embodiment, extension regions 280a, 280b, 280c, and 280d and halo regions 290a, 290b, 290c, and 290d are formed in silicon layer 220 using a method similar to the method for forming the extension regions 310a, 310b and the halo regions 320a, 320b of FIG. 3.

Figure 14:
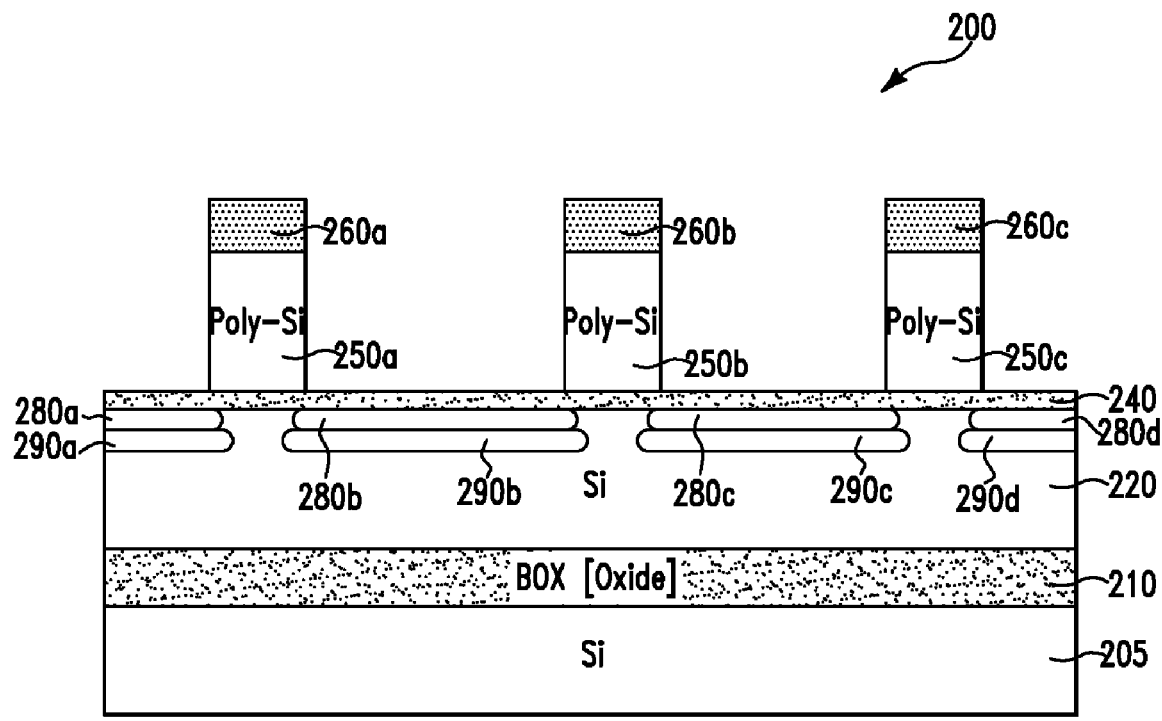
Figure 15A:
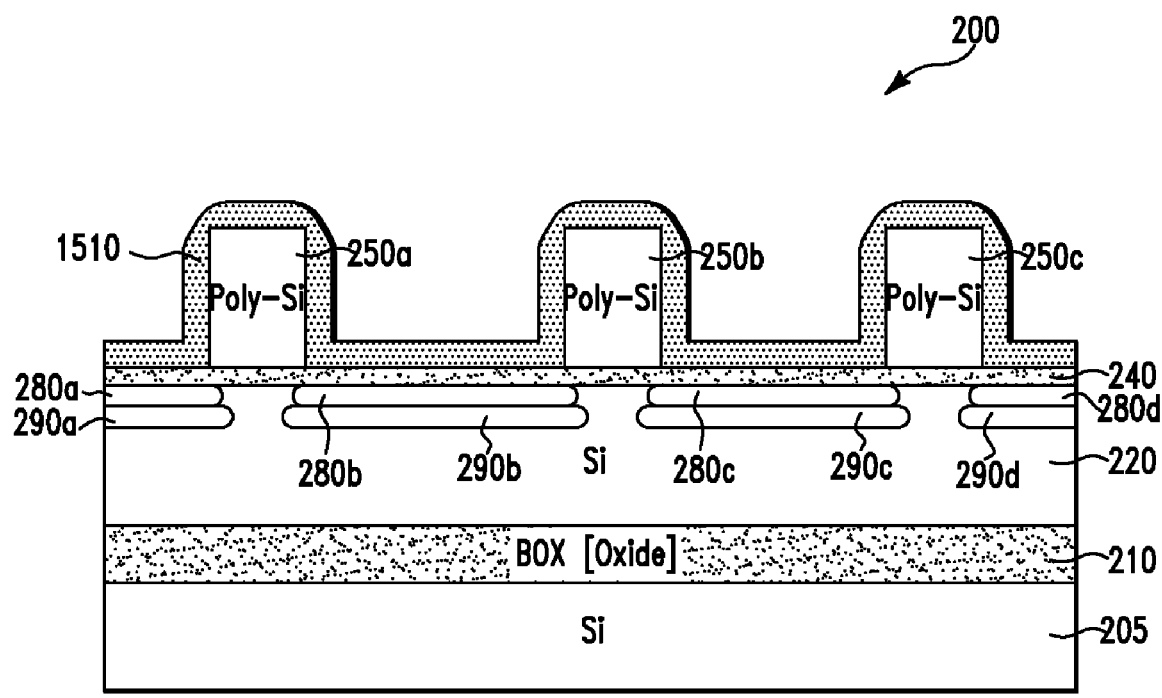

Next, with reference to FIG. 15A, in one embodiment, a nitride spacer layer 1510 is formed on top of the structure 200 of FIG. 14 using a method similar to the method for forming the nitride spacer layer 410 of FIG. 4A.

Figure 15B:
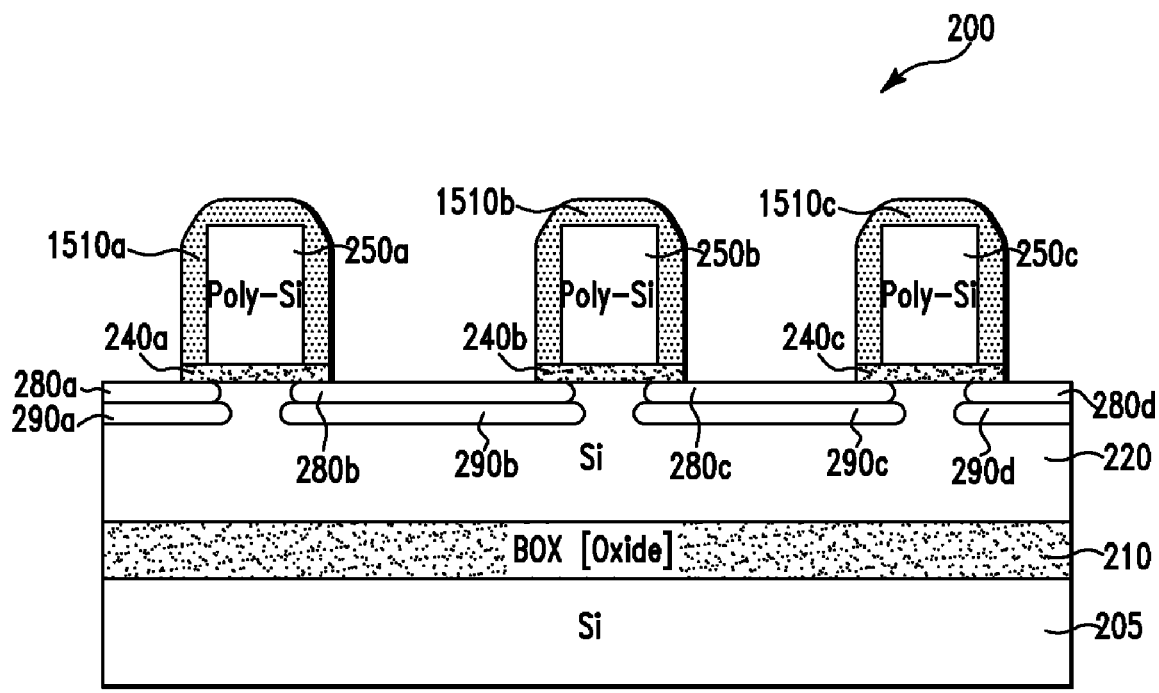

Next, with reference to FIG. 15B, in one embodiment, nitride spacer regions 1510a, 1510b, and 1510c and gate dielectric regions 240a, 240b, and 240c are created using a method similar to the method for forming the nitride spacer region 410' and the gate dielectric region 140' of FIG. 4B.

Figure 16:
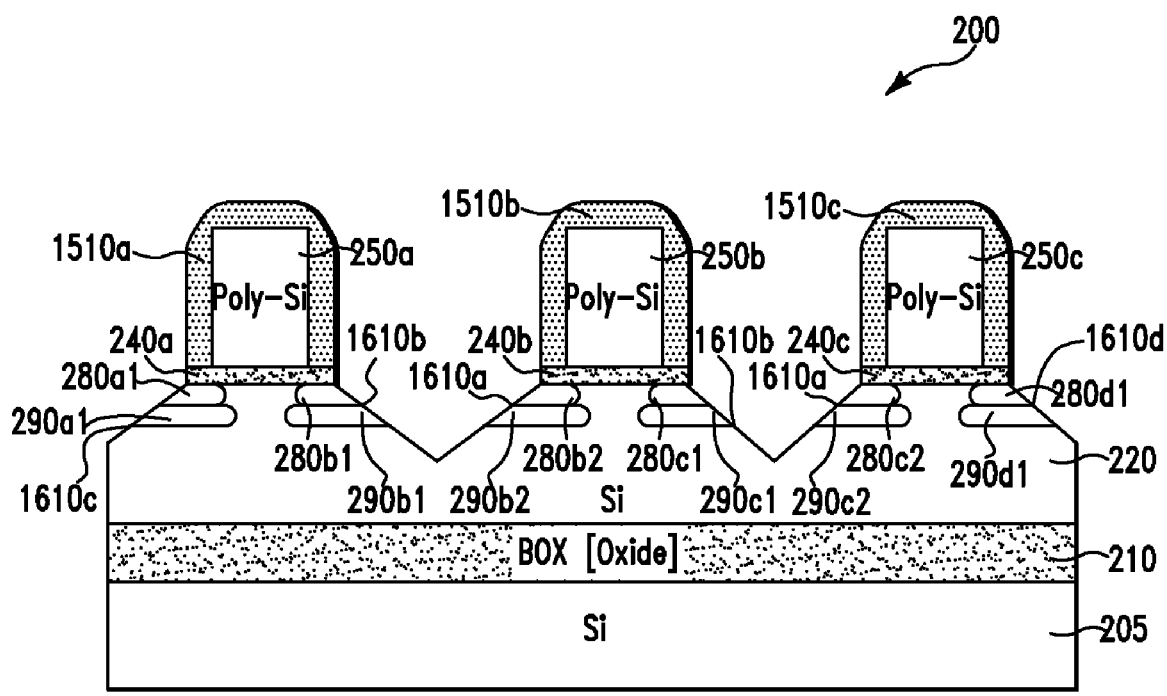

Next, with reference to FIG. 16, in one embodiment, surfaces 1610a, 1610b, 1610c and 1610d are created using a process similar to the process of forming the surfaces 500 and 510 of FIG. 5. More specifically, in one embodiment, the isotropic etching of the silicon layer 220 uses dilute ammonia. Illustratively, the surfaces 1610a and 1610b form a V-shape.

In one embodiment, the surfaces 1610a and 1610b are in (111) and (111) crystalline planes, respectively, and the angle between the surfaces 500 and 510 is about 70°. This occurs if (a) the top surface of the Si layer 220 (FIG. 12) is in (100) or (110) crystalline plane and (b) the gate direction (which is perpendicular to the page) is <110>. As a result, (100) surfaces are etched faster than (111) surfaces until the (111) surfaces 1610a and 1610b meets. Then, the etch is stopped resulting in the structure 200 of FIG. 16.

In an alternative embodiment, the surfaces 1610a and 1610b are in (110) and (110) crystalline planes, respectively, and the angle between the surfaces 500 and 510 is about 90°. This occurs if (a) the top surface of the Si layer 220 (FIG. 12) is in (100) crystalline plane and (b) the gate direction (which is perpendicular to the page) is <100>.

Figure 17:
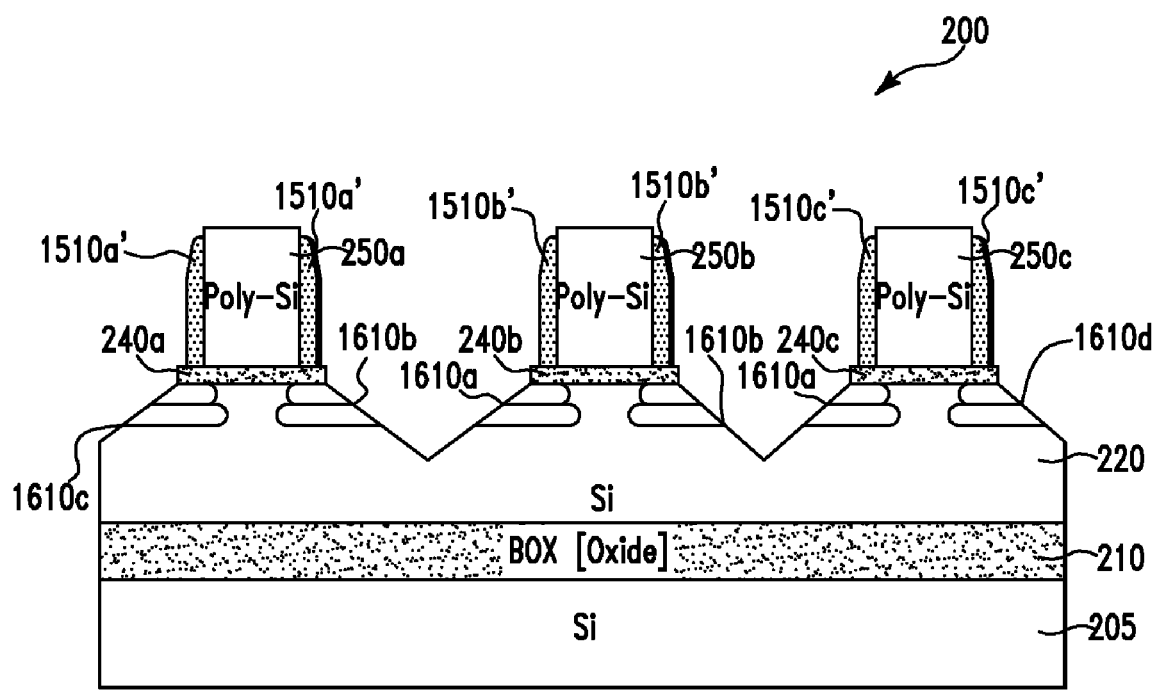

Next, in one embodiment, the nitride spacer regions 1510a, 1510b, and 1510c are anisotropically etched until top surfaces 252a, 252b, and 252c of the gate electrode regions 250a, 250b, and 250c, respectively, are exposed to the surrounding ambient resulting in the structure 200 of FIG. 17. As a result of the etching the nitride spacer regions 1510a, 1510b, and 1510c of FIG. 16, what remain of the nitride spacer regions 1510a, 1510b, and 1510c are nitride spacer regions 1510a', 1510b', and 1510c' of FIG. 17.

Figure 18:
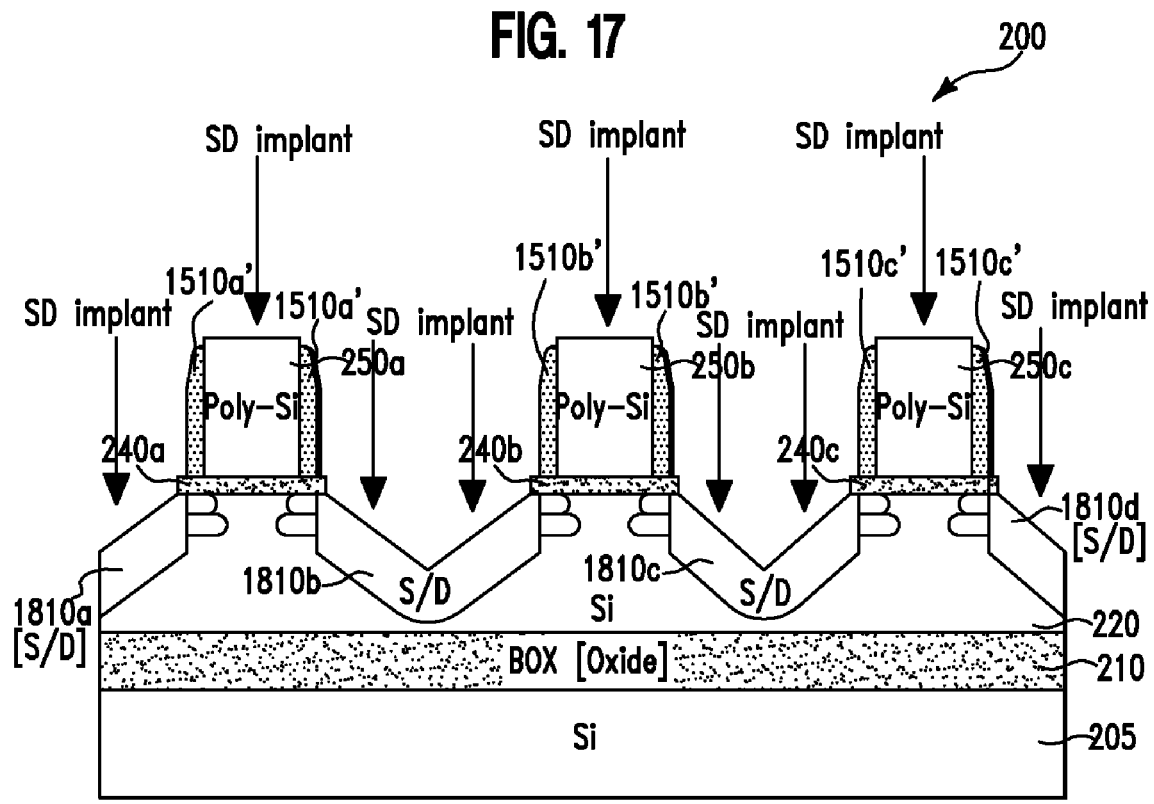

Next, with reference to FIG. 18, in one embodiment, source/drain regions 1810a, 1810b, 1810c, and 1810d are formed in the silicon layer 220 using a method similar to the method for forming source/drain regions 710a and 710b of FIG. 7.

Figure 19:
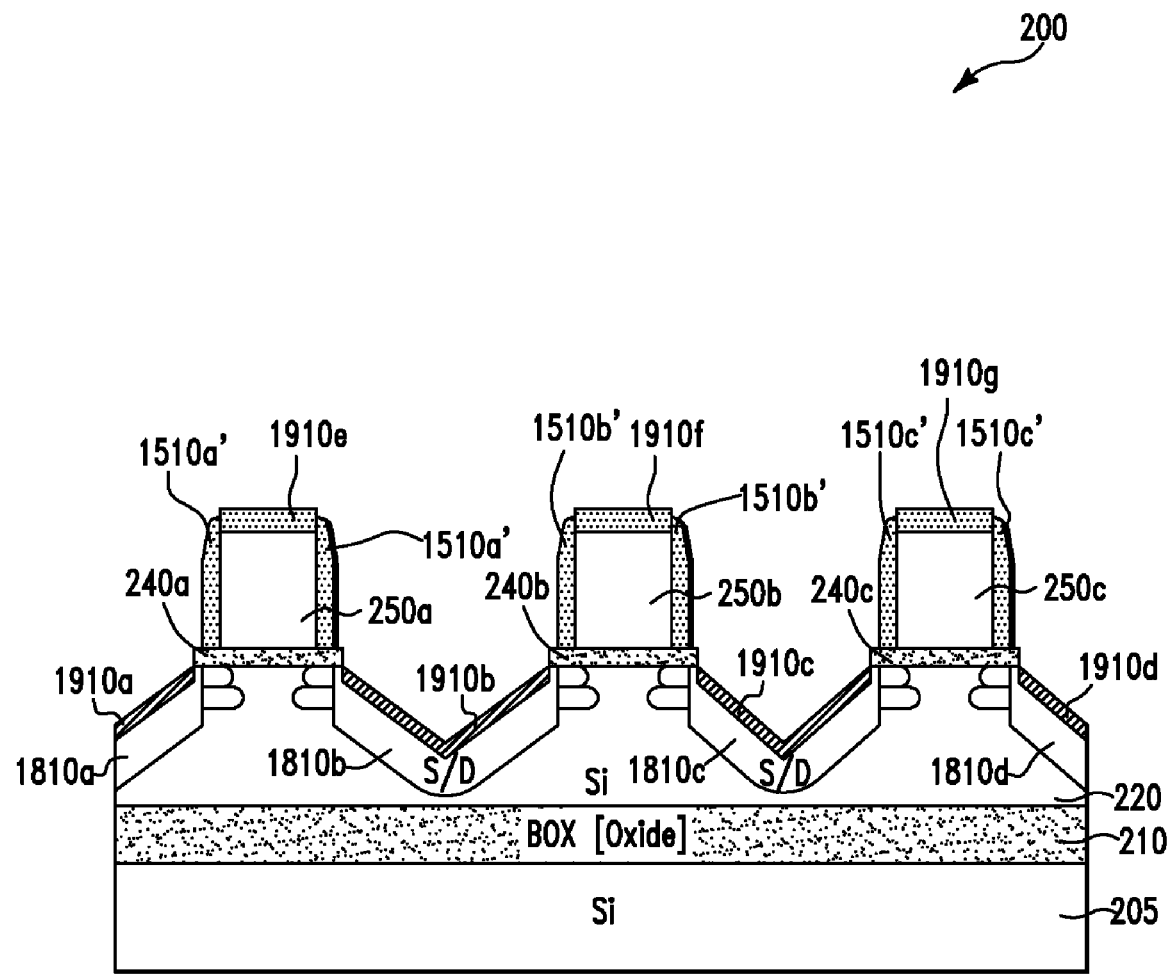

Next, with reference to FIG. 19, in one embodiment, silicide regions 1910a, 1910b, 1910c, 1910d, 1910e, 1910f, and 1910g are formed on top of the source/drain regions 1810a, 1810b, 1810c, and 1810d and the gate electrode regions 250a, 250b, and 250c, respectively. Illustratively, the silicide regions 1910a, 1910b, 1910c, 1910d, 1910e, 1910f, and 1910g can be formed by a method similar to the method for forming silicide regions 810a, 810b, and 810c of FIG. 8.

Figure 20:
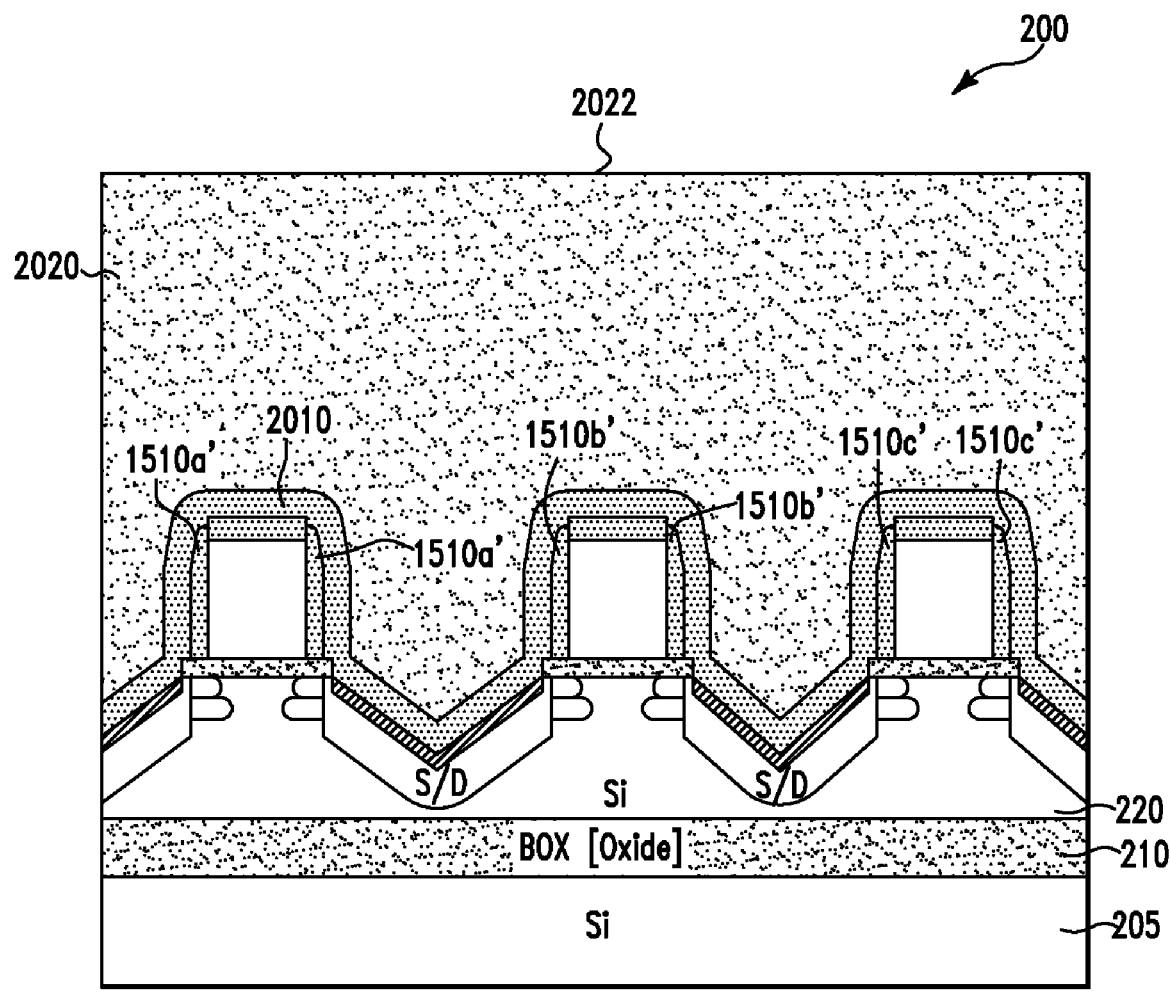

Next, with reference to FIG. 20, in one embodiment, a nitride liner layer 2010 and an oxide layer 2020 are formed on top of the structure 200 of FIG. 19 using a method similar to the method for forming the nitride liner layer 910 and the oxide layer 920 of FIG. 9.

Figure 21:
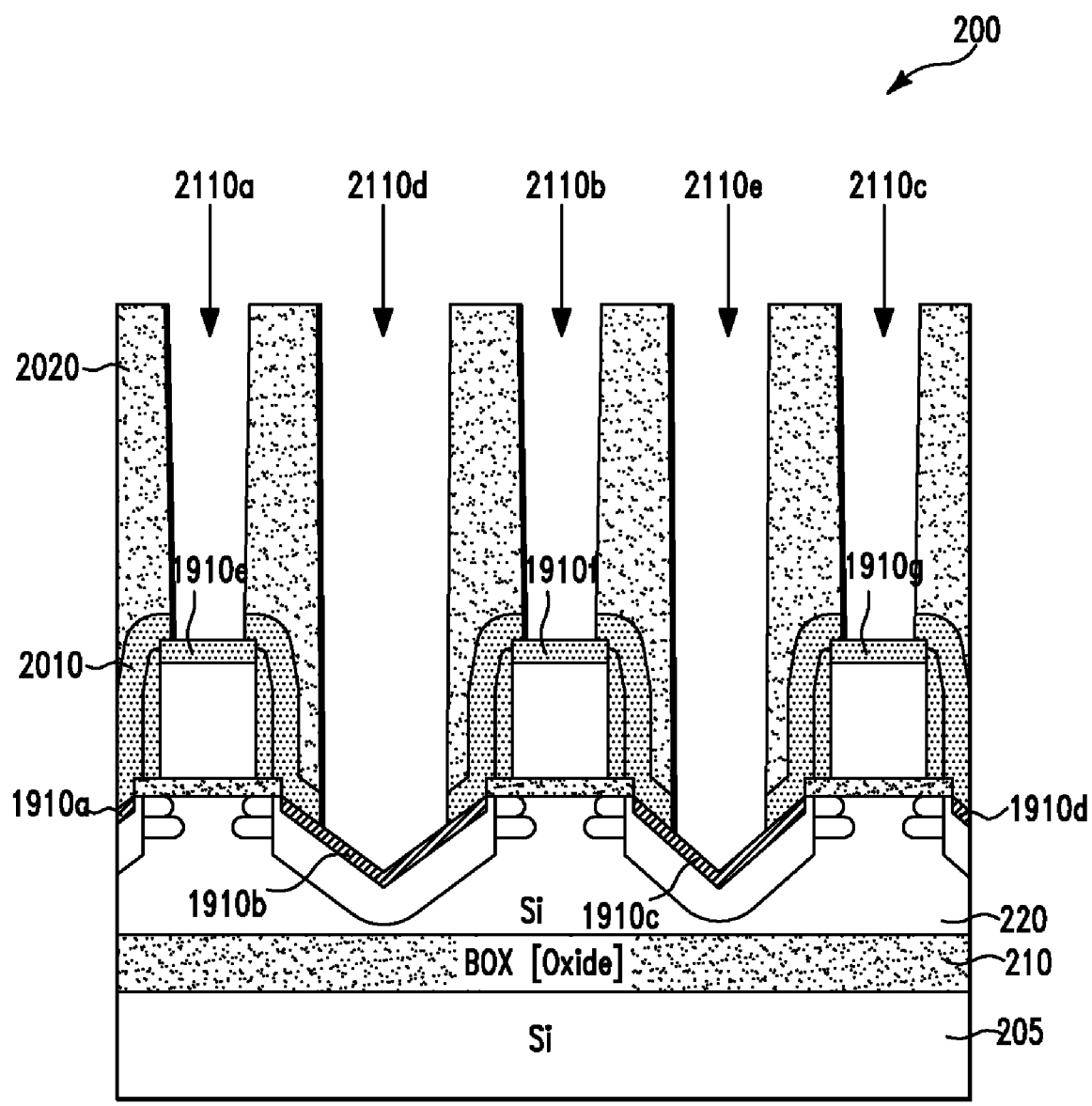

Next, with reference to FIG. 21, in one embodiment, contact holes 2110a, 2110b, 2110c, 2110d and 2110e are created in the oxide layer 2020, the nitride liner layer 2010 using a method similar to the method for creating the contact holes 1010a, 1010b, and 1010c of FIG. 10. Next, in one embodiment, the patterned photoresist layer 2030 can be removed by wet etching.

Figure 22:
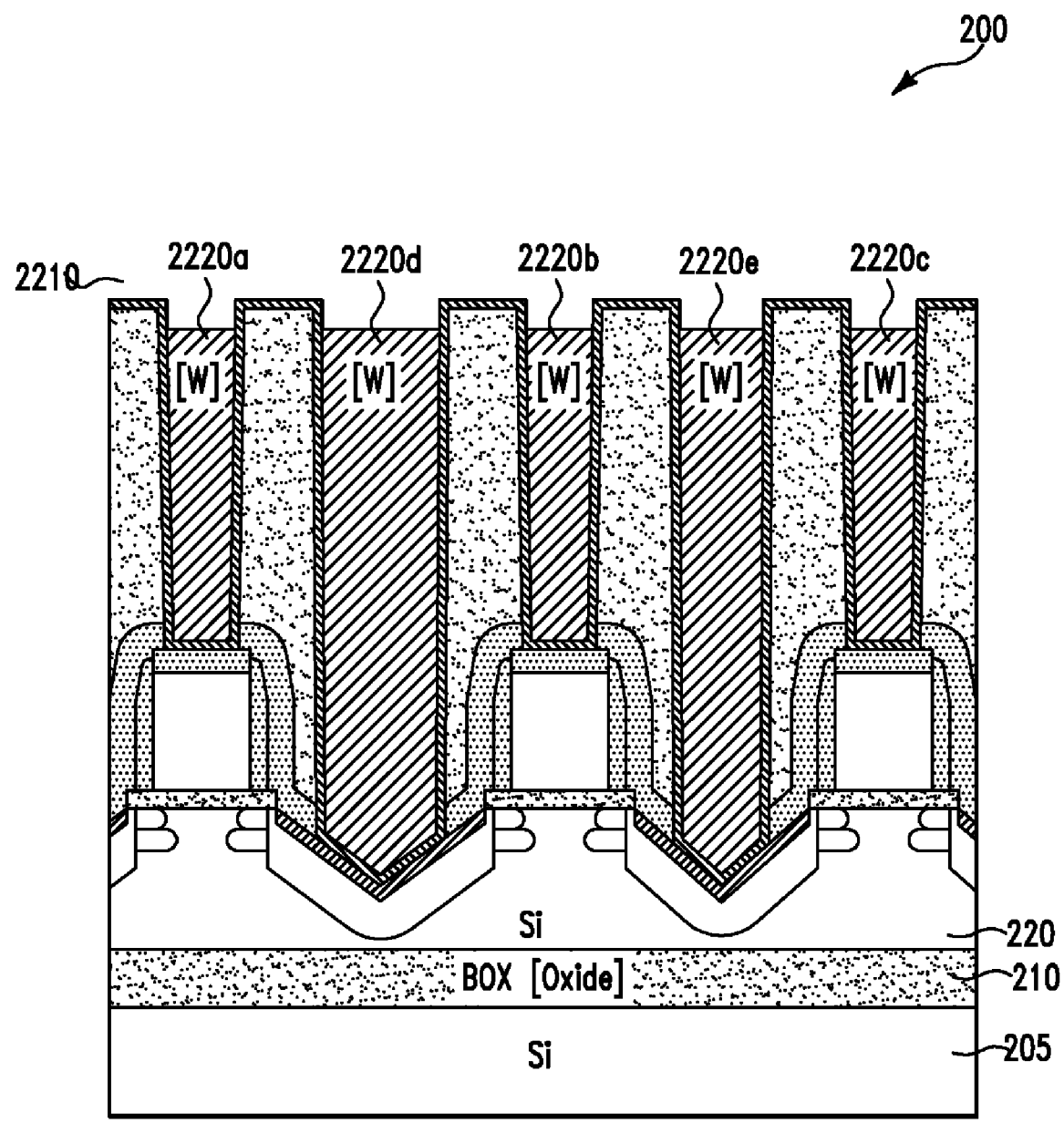

Next, with reference to FIG. 22, in one embodiment, an electric conductive layer 2210 and contact regions 2220a, 2220b, 2220c, 2220d, and 2220e are formed using a method similar to the method for forming the electric conductive layer 1010 and contact regions 1120a, 1120b, and 1120c of FIG. 11A.

Figure 23:
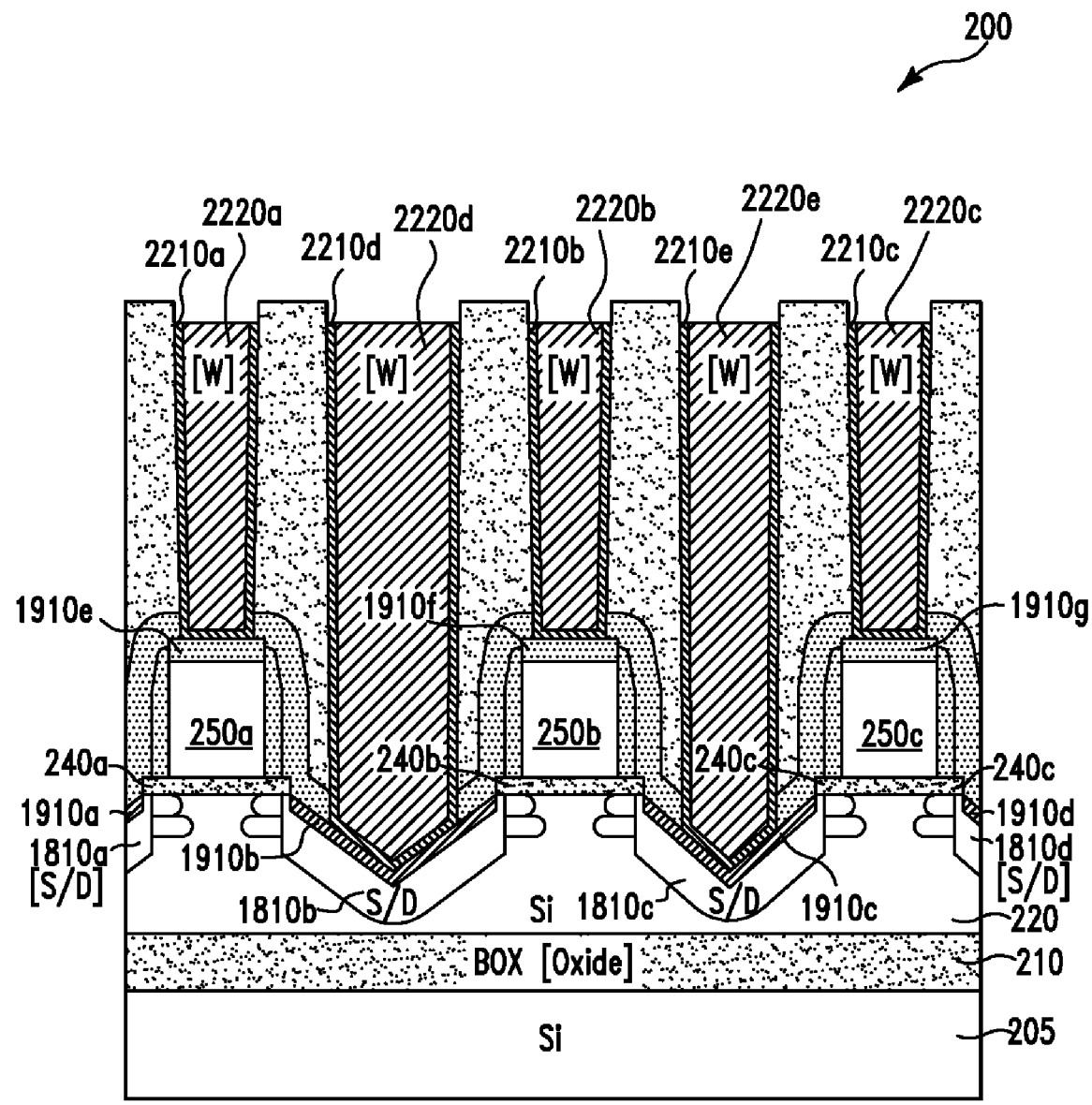

Next, in one embodiment, exposed regions of the electric conductive layer 2210 are etched by, illustratively wet etching resulting in electric conductive regions 2210a, 2210b, 2210c, 2210d and 2210e as shown in FIG. 23.

In summary, contact interfacing surfaces between the silicide regions 1910b and 1910c and the source/drain regions 1810b and 1810c, respectively, are V-shape. As a result, the contact interfacing surfaces are larger than planar contact interfacing surfaces, resulting in lower contact resistance than in the prior art.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
 (a) a semiconductor layer;
 (b) a gate dielectric region on top of the semiconductor layer;
 (c) a gate electrode region on top of the gate dielectric region,
  wherein the gate electrode region is electrically insulated from the semiconductor layer by the gate dielectric region,
  wherein the semiconductor layer comprises a channel region, a first source/drain region, and a second source/drain region, and
  wherein the channel region is disposed between the first and second source/drain regions and directly beneath and electrically insulated from the gate electrode region by the gate dielectric region;
 (d) a first electrically conducting region and a second electrically conducting region on top of the first and second source/drain regions, respectively; and
 (e) a first contact region and a second contact region on top of and electrically coupled to the first and second electrically conducting regions, respectively;
  wherein the first electrically conducting region and the first source/drain region are in direct physical contact with each other at a first common surface and a second common surface,
  wherein the first and second common surfaces are not coplanar,
  wherein the first contact region overlaps both the first and second common surfaces,
  wherein the first common surface makes an angle of about 70°, 90°, 125°, 135°, or 145° with the second common surface,
  wherein the first common surface makes an angle of about 125° with the second common surface, and
  wherein the first and second common surfaces are in (100) and (111) crystalline planes, respectively.

2. A semiconductor structure, comprising:
 (a) a semiconductor layer;
 (b) a gate dielectric region on top of the semiconductor layer;
 (c) a gate electrode region on top of the gate dielectric region,
  wherein the gate electrode region is electrically insulated from the semiconductor layer by the gate dielectric region,
  wherein the semiconductor layer comprises a channel region, a first source/drain region, and a second source/drain region, and
  wherein the channel region is disposed between the first and second source/drain regions and directly beneath and electrically insulated from the gate electrode region by the gate dielectric region;
 (d) a first electrically conducting region and a second electrically conducting region on top of the first and second source/drain regions, respectively; and
 (e) a first contact region and a second contact region on top of and electrically coupled to the first and second electrically conducting regions, respectively;
  wherein the first electrically conducting region and the first source/drain region are in direct physical contact with each other at a first common surface and a second common surface,
  wherein the first and second common surfaces are not coplanar,
  wherein the first contact region overlaps both the first and second common surfaces,
  wherein the first common surface is in (100), (111), or (110) crystalline plane, and
  wherein the second common surface is in (110) or (111) crystalline plane.

3. A semiconductor structure, comprising:
 (a) a semiconductor layer;
 (b) a first gate dielectric region and a second gate dielectric region on top of the semiconductor layer;
 (c) a first gate electrode region on top of the first gate dielectric region,
  wherein the first gate electrode region is electrically insulated from the semiconductor layer by the first gate dielectric region,
  wherein the semiconductor layer comprises a first channel region, a first source/drain region, and a second source/drain region, and
  wherein the first channel region is disposed between the first and second source/drain regions and directly beneath and electrically insulated from the first gate electrode region by the first gate dielectric region;
 (d) a second gate electrode region on top of the second gate dielectric region,
  wherein the second gate electrode region is electrically insulated from the semiconductor layer by the second gate dielectric region,
  wherein the semiconductor layer further comprises a second channel region and a third source/drain region, and
  wherein the second channel region is disposed between the second and third source/drain regions and directly beneath and electrically insulated from the second gate electrode region by the second gate dielectric region;
 (e) a first electrically conducting region, a second electrically conducting region and a third electrically conducting region on top of the first, second, and third source/drain regions, respectively; and
 (f) a first contact region, a second contact region and a third contact region on top of and electrically coupled to the first, second and third electrically conducting regions, respectively;
  wherein the second electrically conducting region and the second source/drain region are in direct physical contact with each other at a first common surface and a second common surface,
  wherein the first and second common surfaces are not coplanar, and wherein the second contact region overlaps both the first and second common surfaces.

4. The semiconductor structure of claim 3,
wherein the first electrically conducting region and the first source/drain region are in direct physical contact with each other at a third common surface and a fourth common surface,
wherein the third and fourth common surfaces are not coplanar, and
wherein the first contact region overlaps both the third and fourth common surfaces.

5. The semiconductor structure of claim 4,
wherein the third electrically conducting region and the third source/drain region are in direct physical contact with each other at a fifth common surface and a sixth common surface,
wherein the fifth and sixth common surfaces are not coplanar, and
wherein the third contact region overlaps both the fifth and sixth common surfaces.

* * * * *